United States Patent

Chan et al.

(10) Patent No.: US 6,737,337 B1
(45) Date of Patent: May 18, 2004

(54) METHOD OF PREVENTING DOPANT DEPLETION IN SURFACE SEMICONDUCTOR LAYER OF SEMICONDUCTOR-ON-INSULATOR (SOI) DEVICE

(75) Inventors: Simon Siu-Sing Chan, Saratoga, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 86 days.

(21) Appl. No.: 10/134,972

(22) Filed: Apr. 29, 2002

Related U.S. Application Data

(60) Provisional application No. 60/287,195, filed on Apr. 27, 2001.

(51) Int. Cl.[7] ............................................. H01L 21/30
(52) U.S. Cl. ..................... 438/455; 438/459; 438/480; 438/783; 438/784; 438/787; 438/791
(58) Field of Search .................................. 438/455–459

(56) References Cited

U.S. PATENT DOCUMENTS

| | | | |
|---|---|---|---|
| 4,599,792 A | * 7/1986 | Cade et al. ................. 438/454 |
| 4,649,627 A | * 3/1987 | Abernathey et al. ........ 438/153 |
| 4,771,016 A | * 9/1988 | Bajor et al. ................. 438/455 |
| 4,774,196 A | * 9/1988 | Blanchard ................... 438/455 |
| 5,054,683 A | * 10/1991 | Haisma et al. .............. 228/198 |
| 5,231,045 A | * 7/1993 | Miura et al. ................ 438/459 |
| 5,278,077 A | * 1/1994 | Nakato ........................ 438/517 |
| 5,360,752 A | * 11/1994 | Brady et al. ................. 438/459 |
| 5,567,638 A | 10/1996 | Lin et al. |
| 5,629,221 A | 5/1997 | Chao et al. |
| 5,849,627 A | * 12/1998 | Linn et al. ................... 438/455 |
| 5,885,877 A | 3/1999 | Gardner et al. |
| 6,043,138 A | 3/2000 | Ibok |
| 6,214,702 B1 | * 4/2001 | Kim ............................ 438/459 |
| 6,362,075 B1 | * 3/2002 | Czagas et al. ............... 438/455 |

* cited by examiner

*Primary Examiner*—John F. Niebling
*Assistant Examiner*—Angel Roman
(74) *Attorney, Agent, or Firm*—Renner, Otto, Boisselle & Sklar, LLP

(57) ABSTRACT

A method of manufacturing a semiconductor device includes forming a buried insulator layer of a semiconductor-on-insulator (SOI) wafer with a dopant material, such as boron, therein. The insulator material with the dopant material may be formed by a number of methods, for example by thermal oxidation of a semiconductor wafer in the presence of an atmosphere containing the dopant material, by co-deposition of the insulator material and the dopant material, or by co-implantation of an insulator material and the dopant material. The dopant material may be the same as a dopant material in at least a region (e.g., a source, drain, or channel region) of a semiconductor material layer which overlies the insulator layer. The dopant material in the buried insulator layer may advantageously reduce the tendency of dopant material to migrate from the overlying material to the insulator layer, such as during manufacturing operations involving heating.

20 Claims, 2 Drawing Sheets

METHOD OF PREVENTING DOPANT DEPLETION IN SURFACE SEMICONDUCTOR LAYER OF SEMICONDUCTOR-ON-INSULATOR (SOI) DEVICE

This application claims the benefit of U.S. Provisional Application No. 60/287,195, filed Apr. 27, 2001, which is hereby incorporated by reference.

BACKGROUND OF THE INVENTION

1. Field of Invention

The present invention relates to the manufacture of semiconductor devices, and in particular to methods of preventing dopant depletion in active regions of such devices built on semiconductor-on-insulator (SOI) substrates.

2. Description of the Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the channel being doped oppositely to the drain and source. The gate electrode is separated from the semiconductor substrate by a thin insulating layer (i.e., a gate dielectric layer) such as an oxide. The operation of the IGFET involves application of an input voltage to the gate electrode, which sets up a transverse electric field in the channel in order to modulate the longitudinal conductance of the channel.

In typical IGFET fabrication processes, the source and drain are formed by introducing dopants of a second conductivity type (P or N) into the semiconductor substrate of a first conductivity type (N or P) using a mask. Other steps of IGFET fabrication processes, such as annealing, involve elevated temperatures.

For IGFETs built on SOI substrates, dopant migration into the buried oxide tends to occur during high temperature processing. This dopant migration occurs at higher rates for dopant materials with low atomic weights, such as boron. As active surface semiconductor regions get increasingly thin, as in a fully-depleted SOI devices, the dopant migration can lead to undesirable front channel doping changes, as well as undesirable lowering of the threshold voltage of the unwanted back channel region.

SUMMARY OF THE INVENTION

A method of manufacturing a semiconductor device includes forming a buried insulator layer of a semiconductor-on-insulator (SOI) wafer with a dopant material, such as boron, therein. The insulator layer with the dopant material may be formed by a number of methods, for example by thermal oxidation of a semiconductor wafer in the presence of an atmosphere containing the dopant material, by co-deposition of the insulator material and the dopant material, or by co-implantation of an insulator material and the dopant material. The dopant material may be the same as a dopant material in at least a region (e.g., a source, drain, or channel region) of a semiconductor material layer which overlies the insulator layer. The dopant material in the buried insulator layer may advantageously reduce the tendency of dopant material to migrate from the overlying material to the insulator layer, such as during manufacturing operations involving heating.

According to an aspect of the invention, a method of manufacturing a semiconductor device includes forming a semiconductor-on-insulator (SOI) wafer with a buried insulator layer that includes a dopant material therein.

According to another aspect of the invention, a method of manufacturing a semiconductor device includes forming a buried insulator layer that includes a dopant material therein, wherein the dopant material is placed in the insulator layer during formation of the insulator layer.

According to yet another aspect of the invention, a method of producing a semiconductor device includes the steps of: forming a semiconductor-on-insulator (SOI) wafer which includes a semiconductor bulk layer, a surface semiconductor layer, and an insulator layer between the semiconductor bulk layer and the surface semiconductor layer, wherein the insulator layer includes a dopant material; and forming source, drain and channel regions in the surface semiconductor layer, wherein at least one of the regions is doped with the dopant material.

According to still another aspect of the invention, a method of forming an semiconductor-on-insulator wafer includes the steps of implanting oxygen into a semiconductor wafer, and implanting a dopant material into the semiconductor wafer, wherein the implantations form a doped buried insulator layer in the wafer.

According to a further aspect of the invention, a method of forming an semiconductor-on-insulator wafer includes the steps of forming surface insulator layers on each of a pair of semiconductor wafers, wherein at least one of the surface insulator layers includes a dopant material; and joining the insulator layers together to form a unitary buried doped insulator layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A method of manufacturing a semiconductor device includes forming a buried insulator layer with a dopant material, such as boron, therein. The dopant material in the insulator layer may be the same as a dopant material in at least a portion of an overlying semiconductor material layer, and may serve to inhibit depletion of the dopant material in the overlying layer.

Figure 1:
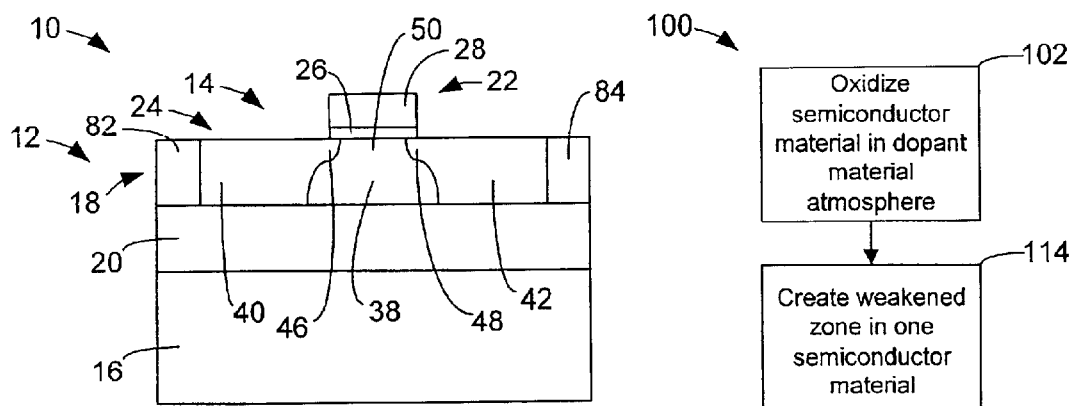
FIG. 1 is a side cross-sectional schematic view of a semiconductor device formed in accordance with the present invention.

Referring initially to FIG. 1, a semiconductor device 10 includes an SOI wafer 12 with a transistor 14 formed thereupon. The SOI wafer 12 includes a semiconductor substrate 16 and a surface semiconductor layer 18, with a buried insulator layer 20 therebetween. As is conventional, the semiconductor substrate 16 and the surface semiconductor layer 18 may be made of silicon and the buried insulator layer 20 may include a silicon oxide such as $SiO_2$, although it will be appreciated that other suitable materials may be used instead or in addition. Further, as described in greater detail below, the buried insulator layer 20 includes a dopant material, such as boron.

The transistor 14 includes a gate 22 formed on an active semiconductor region 24 of the surface semiconductor layer 18. The active semiconductor region may have a thickness of between 100 and 200 Å (Angstroms). The gate 22 includes a gate dielectric 26 and a gate electrode 28. Exemplary materials for the gate dielectric 26 are $SiO_2$ and $Si_3N_4$. The gate electrode 28 may be made of polysilicon or another semiconductor, or may be made in whole or in part of metal.

The active region 24 includes a body 38, with a source 40 and a drain 42 on respective opposite sides of the body. The source 40 and the drain 42 have respective source and drain extensions 46 and 48. The body includes a channel 50 between the source 40 and the drain 42 along the underside of the gate dielectric 26. As is conventional, the body 38 is of different conductivity semiconductor material than the source 40 and the drain 42. For instance, the floating body 48 may be P-conductivity silicon while the source 40 and the drain 42 may be N-conductivity silicon. Alternatively, the floating body 38 may be N-conductivity silicon while the source 40 and the drain 42 may be P-conductivity silicon. Typical dopant materials for achieving N-type conductivity include P, As, and Sb. Typical dopant materials for achieving P-type conductivity include Al, Ga, B, $BF_2$, and In. The dopants may be placed in the active layer 24 when the layer or semiconductor material is formed. Alternatively or in addition, the dopants for one or more of the regions may be added in a later processing step, such as in one or more implanting operations.

The source 40, the drain 42, and the channel 50, are operatively coupled with the gate 22 to function as a transistor. The source 40 and the drain 42 are covered by a metal silicide (also referred to as "silicide regions"), to minimize series resistance. The gate electrode 28 likewise may includes an upper a conductive portion to facilitate electrical connection.

The active region 24 is laterally isolated from other structures of the device 10 by insulator-filled trenches 82 and 84 on opposite sides of the active region. The insulator-filled trenches 82 and 84 may be trenches filled with silicon dioxide ($SiO_2$), produced using known shallow trench isolation (STI) or local oxidation (LOCOS) techniques. It will be appreciated that other suitable isolation structures/techniques may be used alternatively or in addition.

As mentioned above, the insulator layer 20 includes a dopant material, such as the same dopant material used in at least one of the body 38, the source 40, and the drain 42. The dopant material may include a low atomic weight element, such as boron. Examples of such a dopant material include boron and boron fluoride ($BF_2$). The dopant material may have a concentration of between $10^{17}$ and $10^{21}$ atoms/cm$^2$.

The dopant material in the insulator layer 20 advantageously reduces the tendency of dopant material to migrate from the overlying active region 24 to the insulator layer, such as during manufacturing operations involving heating. The presence of the dopant material in the insulator layer 20 may reduce or prevent the loss of dopant material from the back side of the body 38 (where the body intersects the insulator layer 20); may allow a retrograde channel doping profile to be achieved (lower concentration of doping material in the channel 50 than in the body 38 as a whole); and/or may counteract changes to the doping of the front channel 50 which would otherwise occur as a result of doping migration.

The dopant material may be substantially uniformly distributed throughout the insulator layer 20. Alternatively, the concentration of dopant material may be higher in some parts of the insulator layer 20 than in other parts of the insulator layer. For example, the concentration of dopant material may be greater in an upper layer of the insulator layer 20, nearer the active region 24, than in areas of the insulator layer farther from the active region.

Figure 2:
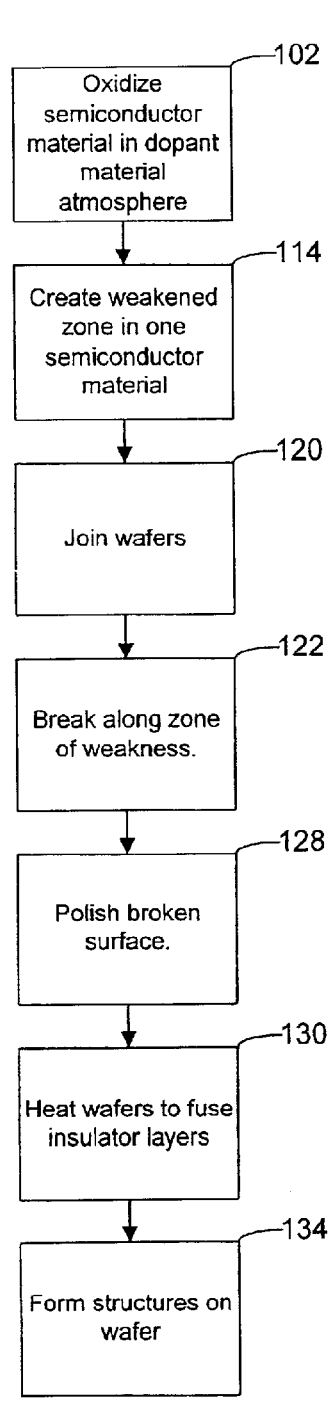
FIG. 2 is a flow chart showing some of the steps of a first embodiment method in accordance with the present invention.

The insulator layer 20 with the dopant material may be formed by any of a variety of methods. As illustrated in FIG. 2, a first method 100 of producing a semiconductor device includes forming the doped insulator layer by a thermal oxidation process. In step 102 respective oxide layers 104 and 106 are grown on semiconductor wafers 108 and 110. One or both of the oxide layers 104 and 106 may be doped oxide layers which include the dopant material. The doped oxide layer(s) are grown by thermally oxidizing the surface of the semiconductor wafer(s) in an atmosphere that contains an oxidizing agent and the dopant material or a compound of the dopant material.

The thermal oxidation may be performed at a temperature of between about 800 and about 1000° C., although it will be appreciated that other temperatures may be employed. The atmosphere for the thermal oxidation may be oxygen, or oxygen and steam, with or without small percentages of HCl.

Figure 3:
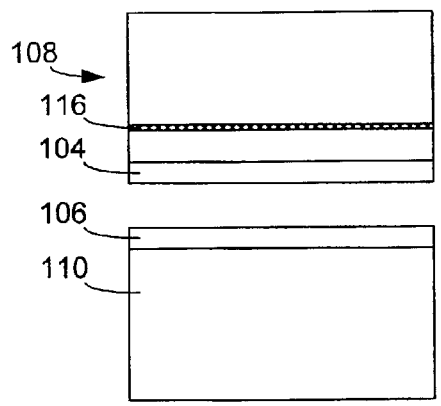
FIGS. 3 and 4 are side cross-sectional schematic views illustrating some of the steps of the method of FIG. 2.

In step 114, a weakened zone 116 (FIG. 3) is created in the semiconductor wafer 108. The weakened zone 116 may be created by conventional methods, such as by a hydrogen implant in the wafer 108. It will be appreciated that the weakened zone 116 may be created by other methods, and/or may be created prior to the formation of the oxide layer 104.

Figure 4:
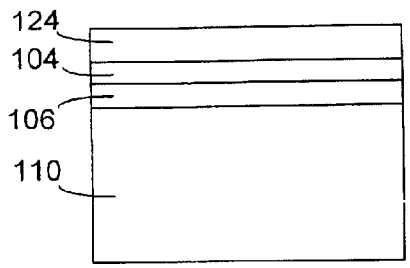

Thereafter, the oxide layers 104 and 106 of the wafers 108 and 110 are joined in step 120. Then in step 122 the wafer 108 is broken along the weakened zone 116. The breaking may be accomplished by a variety of suitable well-known means, such as by use of heat or mechanical pressure. The remaining part 124 of the wafer 108 is then polished in step 128, such as by conventional chemical-mechanical polishing techniques, to produce the device shown in FIG. 4. Following polishing, the device may be heated in step 130 to fuse the oxide layers 104 and 106 together, thereby forming a unitary doped insulator layer. Then structures may be formed on the combined wafer in step 134. The structures may include well-known fabrication processes such as deposition, masking, etching, implanting, and annealing.

It will be appreciated that suitable variations may be made in the order of the above steps. For example, it may be possible to perform the fusing of the oxide layers 104 and 106 (step 130) prior to the breaking along the weakened zone 116 (step 122) and/or the polishing of the remaining part 124 (step 128).

Although the method 100 has been described above with regard to a doped oxide layer, it will be appreciated that a similar suitable method may be employed to create other doped insulator layers, such as a layer including a doped semiconductor nitride.

Figure 5:
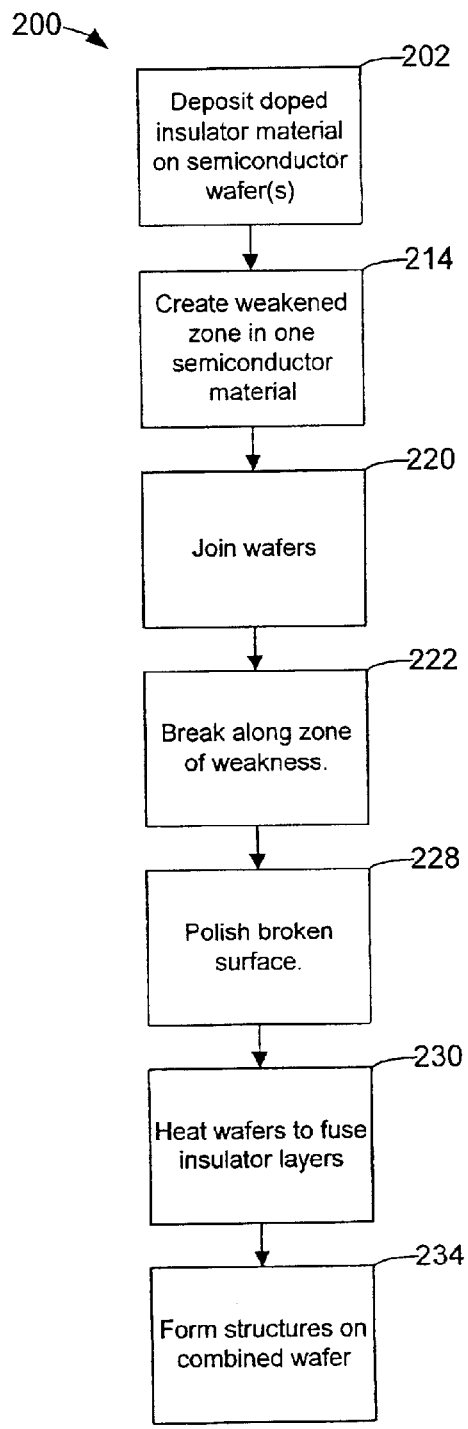
FIG. 5 is a flow chart showing some of the steps of a second embodiment method in accordance with the present invention.

Turning now to FIG. 5, a flow chart shows some steps of a second method 200 for forming a semiconductor device with a doped buried insulator layer. In the method 200 the doped insulator layer is formed in step 202 by a deposition method such as chemical vapor deposition (CVD) of an insulator material (such as an oxide or nitride or a component thereof) and a dopant material. The CVD process may be a single combined process for depositing both the insulator material and the dopant material.

The term "insulator material," as used herein, means materials that are insulators or form insulators when combined with semiconductor material. Thus, for example, SiN and $SiO_2$ are insulator materials, as are the nitrogen and oxygen that may be combined with Si to form SiN and $SiO_2$. Steps 214, 220, 222, 228, 230, and 234 of the method 200 may be similar to the counterpart steps of the method 100.

Figure 6:
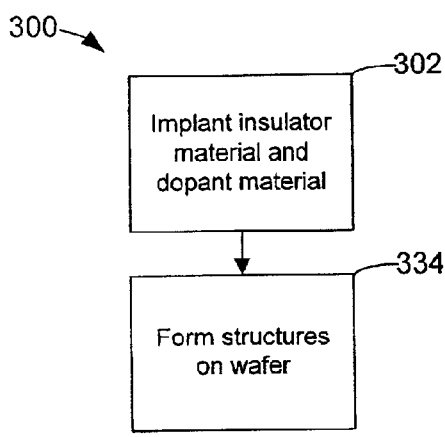
FIG. 6 is a flow chart showing some of the steps of a third embodiment method in accordance with the present invention.
Figure 7:
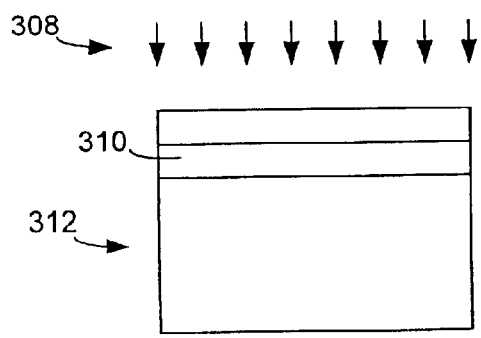
FIG. 7 is a side cross-sectional schematic view illustrating the method of FIG. 6.

The methods 100 and 200 described above are methods which produce bonded SOI materials. In contrast, a third method 300, with some steps shown in FIG. 6, is a variation of SIMOX (separation by implanted oxygen) methods of producing SOI wafers. In step 302 of the method 300, oxygen and a dopant material are co-implanted, as in the implant 308 illustrated in FIG. 7. The implant 308 produces a buried doped oxide layer 310 within a semiconductor wafer 312. The relative amounts of the dopant and the oxide implanted may be $10^{-5}$ to $10^{-2}$. The energies of the implant may be between 20 and 400 keV for the oxygen and between 5 and 100 keV for the dopant material. It will be appreciated that a sequential implantation of the insulation material, followed by the dopant material, or vice versa, may be substituted for the co-implantation.

Thereafter, structures are formed on the SOI wafer in step 334, which may be similar to the step 134 described above.

It will be appreciated that parts of the above-described methods may be employed to fabricate SOI wafers with doped buried insulator layers. Such wafers may be used to produce a variety of semiconductor devices.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the tit specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of producing a semiconductor device comprising:

forming a semiconductor-on-insulator (SOI) wafer which includes a semiconductor bulk layer, a surface semiconductor layer, and an insulator layer between the semiconductor bulk layer and the surface semiconductor layer, wherein the insulator layer includes a dopant material; and forming source, drain and channel regions in the surface semiconductor layer, wherein at least one of the regions is doped with the dopant material, and wherein the forming the SOI wafer includes bonding a pair of doped oxide regions together, wherein the insulator layer is at least one of $SiO_2$ and SiN, and wherein the insulator layer is immediately adjacent the surface semiconductor layer.

2. The method of claim 1, wherein the dopant material is at least one of boron, $BF_2$, Al, Ga, In, P, As, and Sb.

3. The method of claim 1, wherein the forming the SOI wafer includes:

thermally oxidizing a semiconductor wafer in an atmosphere containing the dopant material or a compound of the dopant material, to thereby form a doped surface semiconductor oxide, and fusing the doped surface semiconductor oxide to an oxide layer of another wafer.

4. The method of claim 1, wherein the forming the SOI wafer includes chemical vapor deposition of the dopant material.

5. The method of claim 4, wherein the chemical vapor deposition includes deposition of both the dopant material and an insulator material.

6. The method of claim 1, wherein the forming of the SOI wafer includes co-implantation of the dopant material and an insulator material into a semiconductor, to thereby form the insulator layer with the dopant material.

7. The method of claim 6, wherein the another material includes a material selected from a group of oxygen, nitrogen, or compounds of oxygen and nitrogen.

8. The method of claim 7, wherein the other material includes oxygen.

9. The method of claim 1, wherein the dopant material is placed in the insulator layer during formation of the insulator layer.

10. The method of claim 1, wherein the insulator layer includes a fraction of $10^{-5}$ to $10^{-2}$ of the dopant material.

11. The method of claim 1, wherein the surface semiconductor layer has a thickness between 100 and 2000 Å (Angstroms).

12. The method of claim 1, wherein the channel region is doped with the dopant material.

13. The method of claim 12, wherein the insulator layer has a higher concentration of the dopant material than the channel region.

14. The method of claim 1, wherein the dopant material diffuses substantially uniformly throughout the insulator layer.

15. A method of forming a semiconductor-on-insulator wafer comprising:

forming surface insulator layers on each of a pair of semiconductor wafers, wherein at least one of the surface insulator layers includes a dopant material; and joining the insulator layers together to form a unitary buried doped insulator layer, wherein the surface insulator layers are at least one of SiO$_2$ and SIN, wherein the dopant material in the surface insulator layers is of a single dopant material, and wherein the unitary buried doped insulator layer is immediately adjacent an active region formed from one of the semiconductor wafers.

16. The method of claim 15, wherein the dopant material includes at least one of boron, BF$_2$, Al, Ga, In, P, As, and Sb.

17. The method of claim 15, wherein the surface insulator layers include a semiconductor oxide.

18. The method of claim 17, wherein the forming includes thermal oxidation in an atmosphere containing the dopant material or a compound of the dopant material.

19. The method of claim 15, wherein the forming the SOI wafer includes chemical vapor deposition of the dopant material.

20. The method of claim 19, wherein the chemical vapor deposition includes deposition of both the dopant material and an insulator material.

* * * * *

UNITED STATES PATENT AND TRADEMARK OFFICE
CERTIFICATE OF CORRECTION

PATENT NO. : 6,737,337 B1
DATED : May 18, 2004
INVENTOR(S) : Chan et al.

It is certified that error appears in the above-identified patent and that said Letters Patent is hereby corrected as shown below:

Column 3,
Line 53, remove "a".

Column 4,
Line 37, remove "." after "C."
Line 41, replace "HCI" with -- HCl --.

Column 5,
Line 57, remove "tit".

Column 7,
Line 2, replace "SIN" with -- SiN --.

Signed and Sealed this

Thirtieth Day of November, 2004

JON W. DUDAS
*Director of the United States Patent and Trademark Office*